(12) United States Patent
Isshiki

(10) Patent No.: US 9,156,258 B2
(45) Date of Patent: Oct. 13, 2015

(54) LIQUID EJECTING HEAD, LIQUID EJECTING APPARATUS, PIEZOELECTRIC ELEMENT AND SENSOR

(71) Applicant: Seiko Epson Corporation, Tokyo (JP)

(72) Inventor: Tetsuya Isshiki, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/161,969

(22) Filed: Jan. 23, 2014

(65) Prior Publication Data

US 2014/0210915 A1    Jul. 31, 2014

(30) Foreign Application Priority Data

Jan. 30, 2013  (JP) ................. 2013-016118

(51) Int. Cl.
    *B41J 2/045*    (2006.01)
    *B41J 2/14*    (2006.01)
    *H01L 41/08*    (2006.01)
    *H01L 41/09*    (2006.01)
    *H01L 41/187*    (2006.01)
    *H01L 41/318*    (2013.01)

(52) U.S. Cl.
    CPC .......... *B41J 2/14201* (2013.01); *B41J 2/14233* (2013.01); *H01L 41/0815* (2013.01); *H01L 41/0973* (2013.01); *H01L 41/1878* (2013.01); *B41J 2002/14354* (2013.01); *H01L 41/318* (2013.01)

(58) Field of Classification Search
None
See application file for complete search history.

(56) References Cited

U.S. PATENT DOCUMENTS

| | | | |
|---|---|---|---|
| 2007/0236104 A1* | 10/2007 | Fujii | 310/358 |
| 2007/0241642 A1 | 10/2007 | Miyazawa et al. | |
| 2011/0050811 A1 | 3/2011 | Wang | |
| 2012/0120161 A1* | 5/2012 | Sakai et al. | 347/71 |
| 2012/0147100 A1* | 6/2012 | Nawano et al. | 347/71 |

FOREIGN PATENT DOCUMENTS

| | | |
|---|---|---|
| JP | 2002-083937 A | 3/2002 |
| JP | 2004-066600 A | 3/2004 |
| JP | 2005-340428 A | 12/2005 |
| JP | 2007-287745 A | 11/2007 |
| JP | 2011-046129 A | 3/2011 |

* cited by examiner

*Primary Examiner* — Erica Lin
(74) *Attorney, Agent, or Firm* — Harness, Dickey & Pierce, P.L.C.

(57) ABSTRACT

A liquid ejecting head including a piezoelectric element, the piezoelectric element includes: a first electrode; an orientation control layer provided on the first electrode, the orientation control layer having a perovskite structure including Bi in an A site and Fe and Ti in a B site, and the orientation control layer being self-oriented in a (100) plane; a piezoelectric body layer provided on the orientation control layer and made of a piezoelectric material of the perovskite structure preferentially oriented in the (100) plane; and a second electrode provided on the piezoelectric body layer.

10 Claims, 12 Drawing Sheets

LIQUID EJECTING HEAD, LIQUID EJECTING APPARATUS, PIEZOELECTRIC ELEMENT AND SENSOR

BACKGROUND

1. Technical Field

The present invention relates to a liquid ejecting head including a piezoelectric element having a piezoelectric body layer and electrodes provided in both sides thereof, a liquid ejecting apparatus, a piezoelectric element and a sensor.

2. Related Art

In a piezoelectric element used in an ink jet type recording head or the like which is known as a representative example of a liquid ejecting head, in order to practically increase piezoelectric properties of a piezoelectric body layer, it is preferable that the piezoelectric body layer be oriented in a (100) plane when a crystal system thereof is a rhombohedral system. Then, for example, in order to orient lead zirconate titanate (PZT) in the (100) plane, a technology using titanium species in the piezoelectric body layer is known and, for example, a method for manufacturing the piezoelectric element is disclosed in JP-A-2002-83937 in which after a first layer of the piezoelectric body layer is formed on a lower electrode through a titanium layer, the lower electrode is patterned with the piezoelectric body layer of the first layer and a titanium layer is further formed on the piezoelectric body layer of the first layer and a vibration plate, and then remaining piezoelectric body layers are formed. In addition, a technology using lanthanum nickel oxide (LNO) instead of the titanium layer as an orientation control layer is also known (for example, JP-A-2004-066600 or the like). Furthermore, a technology in which a buffer layer configured of a metal element capable of forming a B site of a PZT crystal is oriented in (100) as a seed layer is also suggested (see JP-A-2005-340428).

However, when manufacturing the ink jet type recording head, the piezoelectric body layer is also deposited on an insulator layer of silicon oxide, zirconium oxide or the like of a ground thereof in addition to on the lower electrode. The seed layer made of the titanium species, LNO and the metal element described above may not be effectively oriented by influence of the ground. Therefore, there is a problem that an orientation state is varied by the ground, thereby decreasing displacement characteristics or durability thereof.

On the other hand, a lead-free piezoelectric material or a piezoelectric material in which content of lead is reduced is required in consideration of environmental issues. As the piezoelectric material in which lead is not contained, for example, there is a piezoelectric material of $BiFeO_3$ system containing Bi and Fe (for example, JP-A-2007-287745); however, the problem of the orientation control described above is also present in the piezoelectric material.

In any case, appearance of the orientation control layer is desired in which various piezoelectric materials can be effectively oriented in the (100) plane without being affected by the ground.

In addition, such a problem is, of course, similarly present in other liquid ejecting heads ejecting droplets other than ink in addition to the ink jet type recording head, and is also similarly present in a piezoelectric element or a piezoelectric actuator which is used others other than the liquid ejecting head.

SUMMARY

An advantage of some aspects of the invention is that it provides a liquid ejecting head including a piezoelectric element using an orientation control layer in which various piezoelectric materials can be effectively oriented in a (100) plane without being affected by a ground, a liquid ejecting apparatus, a piezoelectric element and a sensor.

According to an aspect of the invention, there is provided a liquid ejecting head including a piezoelectric element having a piezoelectric body layer and electrodes provided in the piezoelectric body layer, including: a first electrode; an orientation control layer which is provided on the first electrode, has a perovskite structure, includes Bi in an A site and Fe and Ti in a B site, and is self-oriented in a (100) plane; the piezoelectric body layer which is provided on the orientation control layer and made of a piezoelectric material of the perovskite structure preferentially oriented in the (100) plane; and a second electrode provided on the piezoelectric body layer.

In this case, the orientation control layer is self-oriented in the (100) plane without being affected by the ground, the piezoelectric body layer thereon can be preferentially oriented in the (100) plane, disorder of the orientation in a different interface region from the ground is prevented, and the liquid ejecting head having improved displacement characteristics and durability can be realized by providing the orientation control layer which has the perovskite structure, includes Bi in the A site and Fe and Ti in the B site, and is self-oriented in the (100) plane.

It is preferable that a thickness of the orientation control layer be in a range of 20 nm or more and 80 nm or less. In this case, the orientation of the piezoelectric body layer can be further effectively controlled.

Another aspect of the invention is a liquid ejecting apparatus including the liquid ejecting head according to the above aspect.

In this case, the liquid ejecting apparatus including the liquid ejecting head in which the displacement characteristics and the durability of the piezoelectric element are improved can be realized.

Still another aspect of the invention is a piezoelectric element including: a seed layer which has a perovskite structure, includes Bi in an A site and Fe and Ti in a B site, and is self-oriented in a (100) plane; and a piezoelectric body layer made of a piezoelectric material of the perovskite structure which is provided on the seed layer and is preferentially self-oriented in the (100) plane.

In this case, the orientation control layer is self-oriented in the (100) plane without being affected by the ground, the piezoelectric body layer thereon can be preferentially oriented in the (100) plane, disorder of the orientation or the like in a different interface region from the ground is prevented, and the piezoelectric element having improved displacement characteristics and durability can be realized by providing the orientation control layer which has the perovskite structure, includes Bi in the A site and Fe and Ti in the B site, and is self-oriented in the (100) plane.

Further, still another aspect of the invention is a sensor including the piezoelectric element according to the above aspect.

In this case, the sensor including the piezoelectric element having the piezoelectric body layer which is preferentially oriented in the (100) plane without being affected by the ground can be realized.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiment 1

Figure 1:
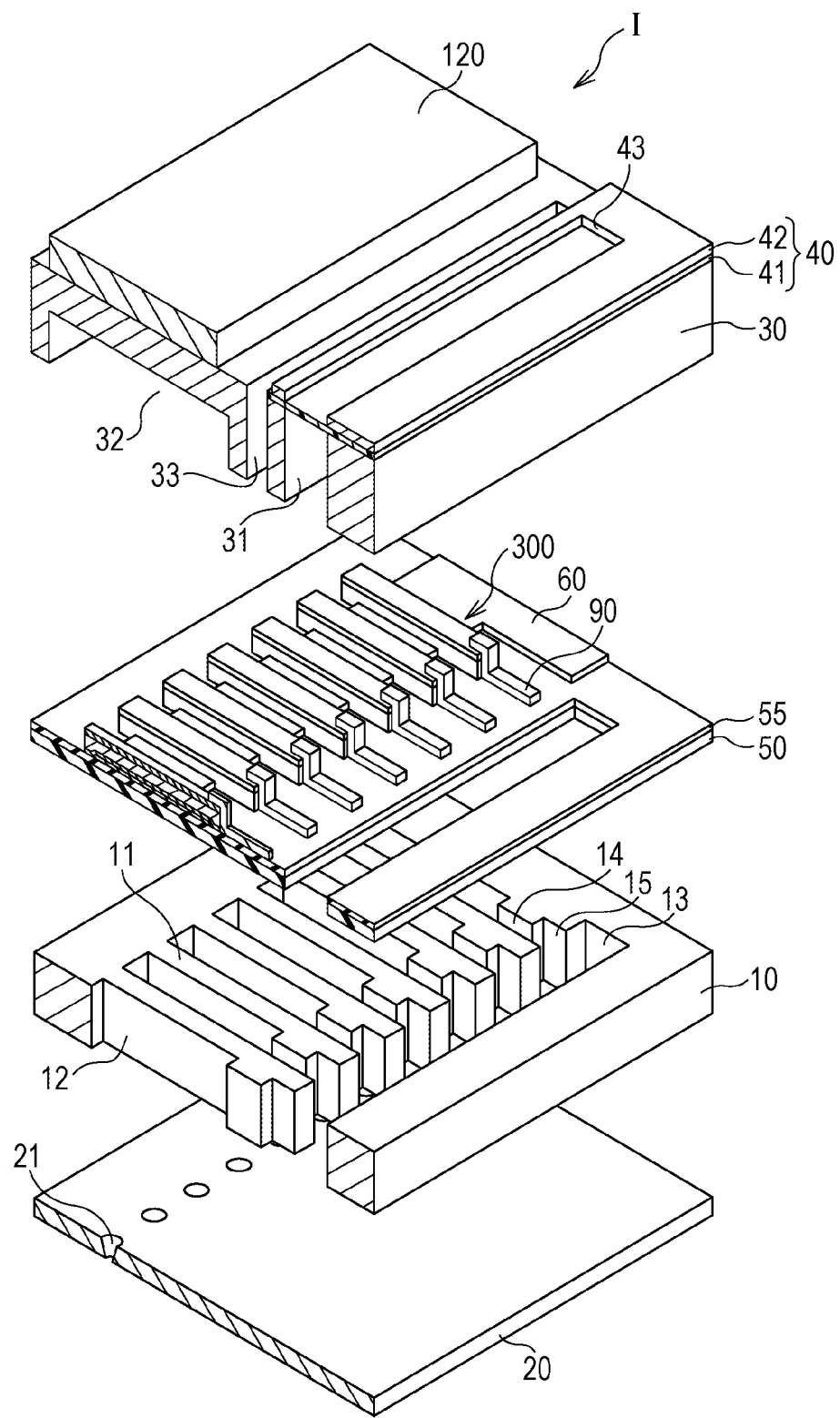
FIG. 1 is an exploded perspective view illustrating a schematic configuration of a recording head according to an embodiment 1.
Figure 2A:
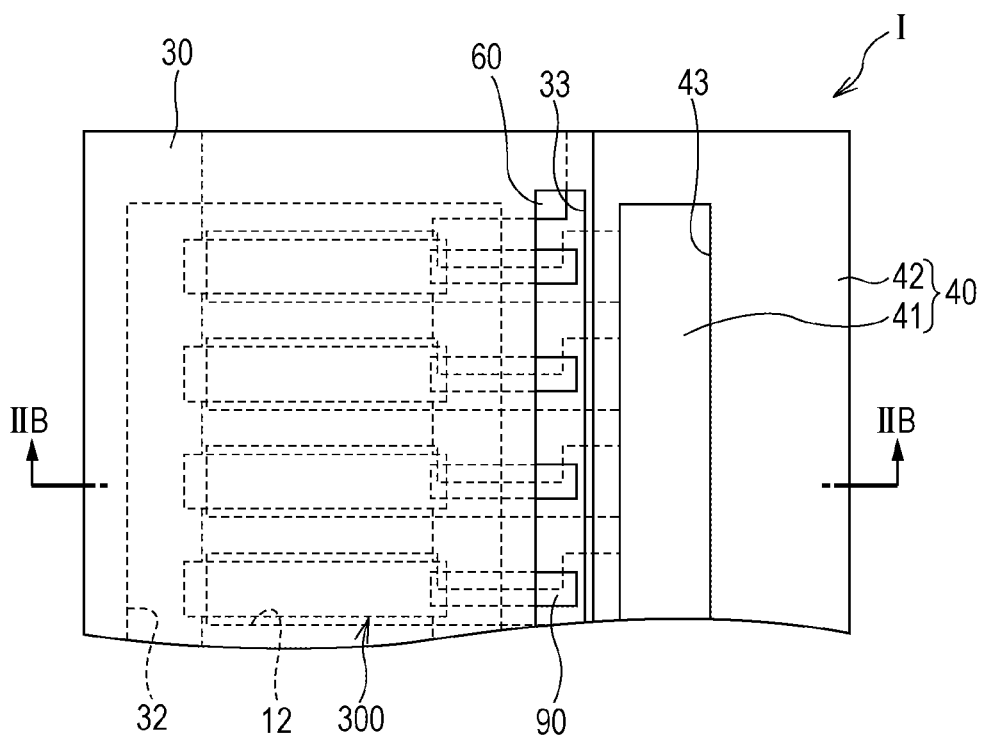
FIGS. 2A and 2B are a plan view and a cross-sectional view of the recording head according to the embodiment 1, respectively.
Figure 2B:
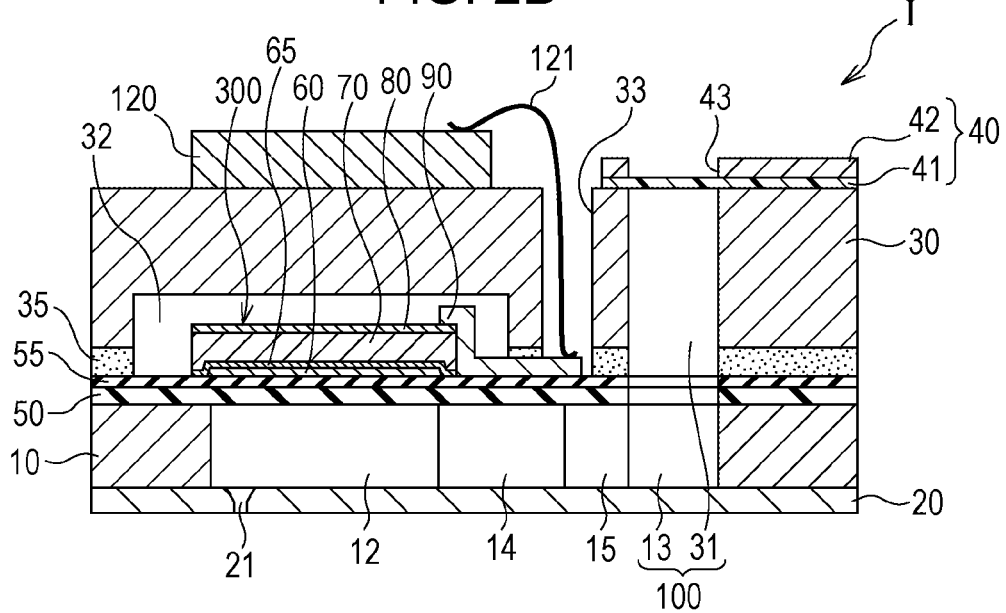

FIG. 1 is an exploded perspective view of an ink jet type recording head that is an example of a liquid ejecting head according to Embodiment 1 of the invention, and FIG. 2A is a plan view of FIG. 1 and FIG. 2B is a cross-sectional view taken along line IIB-IIB of FIG. 2A, respectively. As illustrated in FIGS. 1, 2A and 2B, a flow path forming substrate 10 of this embodiment is made of a single crystal silicon substrate and an elastic film 50 made of silicon dioxide is formed on one side surface thereof.

A plurality of pressure generation chambers 12 are arranged in the flow path forming substrate 10 in a width direction thereof. In addition, a communication section 13 is formed in a region outside the pressure generation chamber 12 of the flow path forming substrate 10 in a longitudinal direction thereof. The communication section 13 communicates with each of the pressure generation chambers 12 through an ink supply path 14 and a communication path 15 provided for each of the pressure generation chambers 12. The communication section 13 configures a part of a manifold which is a common ink chamber of each of the pressure generation chambers 12 in communication with a manifold section 31 of a protective substrate described below. The ink supply path 14 is formed having a width narrower than the pressure generation chamber 12 and constantly maintains a resistance of the flow path of the ink flowing from the communication section 13 into the pressure generation chamber 12. Furthermore, in the embodiment, the ink supply path 14 is formed by narrowing the width of the flow path from one side; however, the ink supply path may be formed by narrowing the width of the flow path from both sides. In addition, the ink supply path may be formed by narrowing in a thickness direction thereof without narrowing the width of the flow path. In the embodiment, the flow path forming substrate 10 has the liquid flow path configured of the pressure generation chamber 12, the communication section 13, the ink supply path 14 and the communication path 15.

In addition, a nozzle plate 20 bored with nozzle openings 21 communicating with the vicinity of an end section of a side opposite to the ink supply path 14 of each of the pressure generation chambers 12 is fixed to an opening surface side of the flow path forming substrate 10 with an adhesive, a thermal adhering film or the like. Furthermore, for example, the nozzle plate 20 is made of a glass ceramic, a single crystal silicon substrate, a stainless steel or the like.

On the other hand, the elastic film 50 is formed on a side opposite to the opening surface of the flow path forming substrate 10 described above and, for example, an insulator layer 55 made of zirconium oxide ($ZrO_2$) or the like is laminated on the elastic film 50. Furthermore, an adhesion layer made of titanium oxide or the like may be provided on the insulator layer 55, if necessary.

In addition, a first electrode 60, an orientation control layer 65 provided above the first electrode 60 and having a thickness of, for example, 20 nm to 80 nm, a piezoelectric body layer 70 provided on the orientation control layer 65 and made of a thin film having a thickness of 3 μm or less, preferably of 0.3 μm to 1.5 μm, and a second electrode 80 provided above the piezoelectric body layer 70 are laminated on the insulator layer 55 and then configure a piezoelectric element 300. Furthermore, "above" described here is not only referred to as immediately above but also referred to as a state where another member is interposed therebetween. Here, the piezoelectric element 300 is a portion including the first electrode 60, the piezoelectric body layer 70 and the second electrode 80.

Generally, the piezoelectric element 300 is configured such that one electrode is a common electrode and the other electrode is an individual electrode independent of each other. In the embodiment, the first electrode 60 is provided as the individual electrode of each piezoelectric body active section which is a practical driving section of the piezoelectric element 300 and the second electrode 80 is provided as the common electrode which is common in a plurality of piezoelectric body active sections. Here, a portion in which piezoelectric stain is generated by applying a voltage to both electrodes is referred to as the piezoelectric body active section and a portion which is continuous from the piezoelectric body active section, but is not sandwiched between the first electrode 60 and the second electrode 80, and is not driven by the voltage is referred to as a piezoelectric body inactive section. In addition, the piezoelectric element 300 and a vibration plate in which a displacement is generated by driving of the piezoelectric element 300 are referred to as a piezoelectric element; however, they may be referred to as an actuator device.

In addition, in the embodiment described above, the elastic film 50, the insulator layer 55 and the first electrode 60 serve as the vibration plate which is deformed with the piezoelectric element 300; however, of course, the invention is not limited to the configuration and, for example, only the first electrode 60 may serve as the vibration plate without providing the elastic film 50 and the insulator layer 55. However, when the first electrode 60 is directly provided on the flow path forming substrate 10, it is preferable that the first electrode 60 be protected by an insulation protective film or the like so as not to be conducted between the first electrode 60 and the ink.

The orientation control layer 65 is a composite oxide having a perovskite structure and containing Bi in an A site and Fe and Ti in a B site, and is self-oriented in the (100) plane. Specifically, oxygen has 12-coordination in the A site of an $ABO_3$ type structure and oxygen has 6-coordination in the B site thereby making an eight-faced body (octahedron). It is preferable that the composite oxide configuring the orientation control layer 65 be basically configured of Bi in the A site, and Fe and Ti in the B site. It is preferable that a preferred composition ratio be a range of $40 \leq x \leq 60$ when an element ratio is expressed in Bi:Fe:Ti=100:x:(100-x). The composite oxide having the composition ratio described above is not affected by a ground and is self-oriented in the (100) plane, and functions as the orientation control layer where a piezoelectric material having the perovskite structure which is deposited thereon is oriented in the (100) plane. That is, as will be described in detail later, since the orientation control layer 65 is deposited after patterning the first electrode 60, the deposition is performed on the first electrode 60 and on the insulator layer 55, and the self-orientation is performed in the (100) plane on any ground and then the piezoelectric body layer 70 deposited thereafter can be preferentially oriented reliably in the (100) plane. Particularly, unevenness of a crystal state of the piezoelectric body layer 70 is also reduced in the vicinity of a boundary between the first electrode 60 and the insulator layer 55.

Here, self-orienting in the (100) plane is referred to as the orientation in the (100) plane itself without being affected by the substrate, and includes a case where all crystals are oriented in the (100) plane and a case where most of the crystals (for example, 80% or more) are oriented in the (100) plane.

Furthermore, a composite oxide may be used in which a part of the elements in the A site and the B site are substituted by another element in a range that such a function is not inhibited and the composite oxide is also included in the orientation control layer of the invention. For example, elements such as Ba, Sr and La in addition to Bi may be present in the A site and elements such as Zr and Nb may be further present in the B site with Fe and Ti. In addition, those which are shifted from the stoichiometric composition ($ABO_3$) due to deficiency or excess in the elements (Bi, Fe, Ti and O) are also included in the orientation control layer of the invention as long as it has the function described above. For example, it is confirmed that the composite oxide in which Bi is contained excessively from the stoichiometric proportion is also self-oriented in the (100) plane and functions as the orientation control layer as described below.

In addition, the orientation control layer 65 has the same perovskite structure as the piezoelectric material forming the piezoelectric body layer 70 described below and has small piezoelectric properties, and the orientation control layer 65 and the piezoelectric body layer 70 can be referred to as the piezoelectric body layer.

The piezoelectric body layer 70 is a piezoelectric material made of the composite oxide having the perovskite structure, that is, $ABO_3$ type structure. Furthermore, the perovskite structure is a structure in which oxygen has 12-coordination in the A site and oxygen has 6-coordination in the B site thereby making the eight-faced body (octahedron). As the piezoelectric material, for example, lead zirconate titanate (PZT) or that obtained by adding a metal oxide such as niobium oxide, nickel oxide or magnesium oxide thereto can be used. Specifically, lead titanate ($PbTiO_3$), lead zirconate titanate ($Pb(Zr,Ti)O_3$), lead zirconate ($PbZrO_3$), lead lanthanum titanate ($(Pb,La), TiO_3$), lead lanthanum zirconate titanate ($(Pb,La)(Zr,Ti)O_3$), magnesium niobate zirconium lead titanate ($Pb(Zr,Ti)(Mg,Nb)O_3$) or the like can be used.

In addition, the material of the piezoelectric body layer 70 is not limited to a lead-based piezoelectric material containing lead and a non-lead-based piezoelectric material that does not contain lead and has the perovskite structure can be used. As the non-lead-based piezoelectric material, for example, bismuth ferrite (($BiFeO_3$), abbreviation "BFO"), barium titanate (($BaTiO_3$), abbreviation "BT"), potassium sodium niobate (($K,Na)(NbO_3)$, abbreviation "KNN"), potassium sodium lithium niobate (($K,Na,Li)(NbO_3)$), potassium sodium lithium niobate tantalate (($K,Na,Li)(Nb,Ta)O_3$), bismuth potassium titanate (($Bi_{1/2}K_{1/2})TiO_3$, abbreviation "BKT"), bismuth sodium titanate (($Bi_{1/2}Na_{1/2})TiO_3$, abbreviation "BNT"), bismuth manganate ($BiMnO_3$, abbreviation "BM"), a composite oxide ($x[(Bi_xK_{1-x})TiO_3]$-(1-X)$[BiFeO_3]$, abbreviation "BKT-BF") having the perovskite structure containing bismuth, potassium, titanium and iron, a composite oxide ($(1-x)[BiFeO_3]$-$x[BaTiO_3]$, abbreviation "BFO-BT") having perovskite structure containing bismuth, iron, barium, and titanium, those ($(1-x)[Bi(Fe_{1-y}M_y)O_3]$-$x[BaTiO_3]$(M is Mn, Co or Cr)) adding metal such as manganese, cobalt and chromium thereto or the like can be used.

The piezoelectric material having the perovskite structure described above inherits crystal orientation of the orientation control layer 65 and is preferentially oriented in the (100) plane by being deposited on the orientation control layer 65. Here, in the invention, the preferential orientation is referred to as $(100)/[(100)+(110)]$ is 60% or more and preferably 70% or more when a peak intensity derived from the (100) plane of XRD is compared to a peak intensity derived from the (110) plane. Of course, it is preferable that proportion of the peak in the (100) plane be large in consideration of improvement of displacement characteristics and durability of the piezoelectric body layer 70, $(100)/[(100)+(110)]$ is preferably 80% or more and $(100)/[(100)+(110)]$ is further preferably 90% or more. In addition, it is confirmed that $(100)/[(100)+(110)]$ is 90% or more in the following embodiments. In addition, it is preferable that the piezoelectric material be a rhombohedral crystal in consideration of superiority in displacement characteristics when preferentially orienting in the (100) plane.

As the second electrode 80, any of various types of metals such as Ir, Pt, tungsten (W), tantalum (Ta) and molybdenum (Mo) may be used, and alloys thereof or a metal oxide such as iridium oxide may be used.

Each lead electrode 90 of gold (Au) or the like, which is drawn from the vicinity of the end section on the ink supply path 14 side and is extended on the insulator layer 55 of the flow path forming substrate 10, is connected to the second electrode 80 of each piezoelectric element 300 described above. The voltage is selectively applied to each piezoelectric element 300 through the lead electrode 90.

A protective substrate 30 having the manifold section 31 configuring at least a part of a manifold 100 is bonded on the flow path forming substrate 10 where the piezoelectric element 300 is formed, that is, on the first electrode 60, the elastic film 50 and the lead electrode 90 through an adhesive 35. In the embodiment, the manifold section 31 is formed throughout the pressure generation chamber 12 in the width direction by penetrating the protective substrate 30 in the thickness direction thereof, and configures the manifold 100 which is the common ink chamber of each pressure generation chamber 12 in communication with the communication section 13 of the flow path forming substrate 10 as described above.

In addition, a piezoelectric element holding section 32 having a space to an extent that does not inhibit the movement of the piezoelectric element 300 is provided in a region of the protective substrate 30 facing the piezoelectric element 300. The piezoelectric element holding section 32 may be used if the space to an extent which does not inhibit the movement of the piezoelectric element 300 and the space may be or may not be sealed.

As the protective substrate 30, it is preferable that a material having substantially the same coefficient of thermal expansion of the flow path forming substrate 10, for example, glass, ceramic material or the like be used, and in the embodiment, the protective substrate 30 is formed using the single crystal silicon substrate of the same material as the flow path forming substrate 10.

Furthermore, the protective substrate 30 has a through hole 33 penetrating the protective substrate 30 in the thickness direction thereof. Thus, the vicinity of the end section of the lead electrode 90 drawn from each piezoelectric element 300 is provided so as to be exposed to the inside of the through hole 33.

Furthermore, a driving circuit 120 for driving the piezoelectric element 300 which is arranged is fixed to the protective substrate 30. As the driving circuit 120, for example, a circuit substrate, a semiconductor integrated circuit (IC) or the like can be used. Thus, the driving circuit 120 and the lead electrode 90 are electrically connected to each other through a connection wiring 121 made of a conductive wire such as a bonding wire.

Furthermore, a compliance substrate 40 made of a sealing film 41 and a fixing plate 42 is bonded on the protective substrate 30. Here, the sealing film 41 is made of a material (for example, a polyphenylene sulfide (PPS) film having a thickness of 6 μm) having low rigidity and flexibility, and one side surface of the manifold section 31 is sealed by the sealing film 41. Furthermore, the fixing plate 42 is formed using a hard material (for example, a stainless steel (SUS) having a thickness of 30 μm or the like) such as a metal. Since a region of the fixing plate 42 facing the manifold 100 is an opening section 43 removed completely in the thickness direction thereof, one side surface of the manifold 100 is sealed only by the sealing film 41 having flexibility.

The ink jet type recording head of the embodiment described above is configured such that the ink is taken from an ink introduction port connected to an external ink supply unit (not illustrated) and the voltage is applied between the first electrode 60 and the second electrode 80 corresponding to the pressure generation chamber 12, respectively according to a recording signal from the driving circuit 120, after the ink is filled in the inside thereof from the manifold 100 to the nozzle opening 21, and a pressure inside each pressure generation chamber 12 is increased and then ink droplets are ejected from the nozzle opening 21 by bending the elastic film 50, the insulator layer 55, the first electrode 60 and the piezoelectric body layer 70.

Next, a method for manufacturing an ink jet type recording head of the embodiment will be described with reference to FIGS. 3A to 6C. In addition, FIGS. 3A to 6C are cross-sectional views of the pressure generation chambers in the longitudinal direction (second direction) thereof.

Figure 3A:
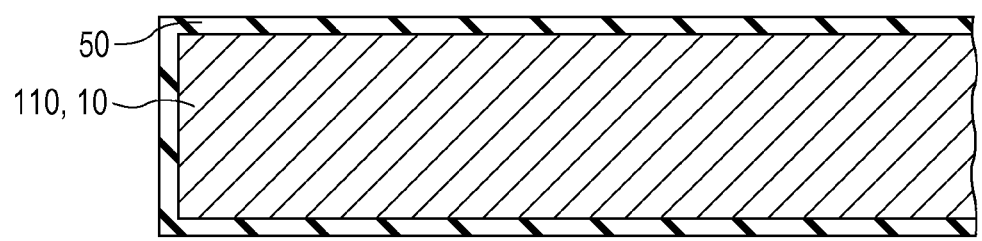
FIGS. 3A and 3B are cross-sectional views illustrating a process of manufacturing the recording head according to the embodiment 1.
Figure 3B:
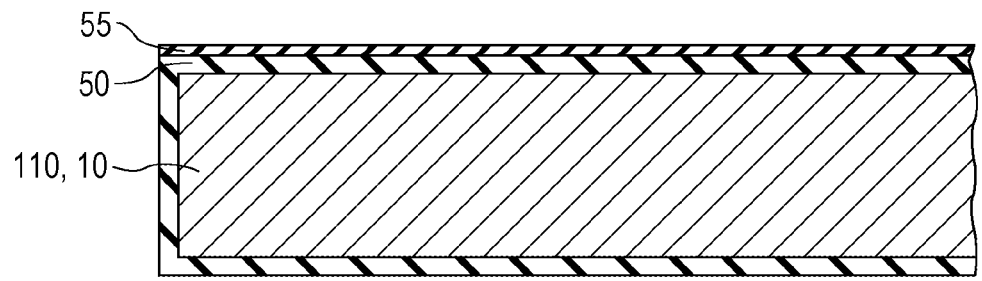

First, as illustrated in FIG. 3A, a silicon dioxide film made of silicon dioxide ($SiO_2$) or the like configuring the elastic film 50 is formed on a surface of a wafer for the flow path forming substrate that is a silicon wafer. Next, as illustrated in FIG. 3B, the insulator layer 55 made of zirconium oxide or the like is formed on the elastic film 50 (silicon dioxide film).

Figure 4A:
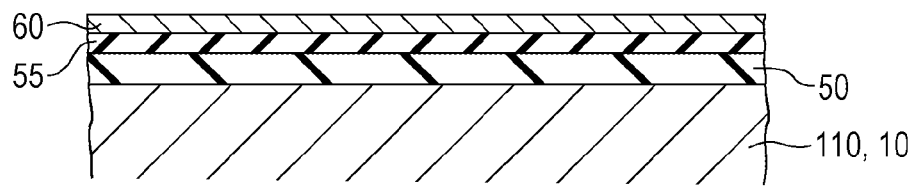
FIGS. 4A to 4D are cross-sectional views illustrating the process of manufacturing the recording head according to the embodiment 1.
Figure 4B:
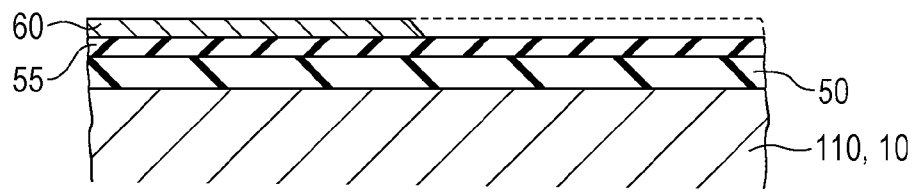

Next, as illustrated in FIG. 4A, the first electrode 60 made of platinum is formed on an entire surface of the insulator layer 55 using a sputtering method, a vapor deposition method or the like. Next, as illustrated in FIG. 4B, the first electrode 60 is patterned by masking a resist (not illustrated) of a predetermined shape on the first electrode 60.

Figure 4C:
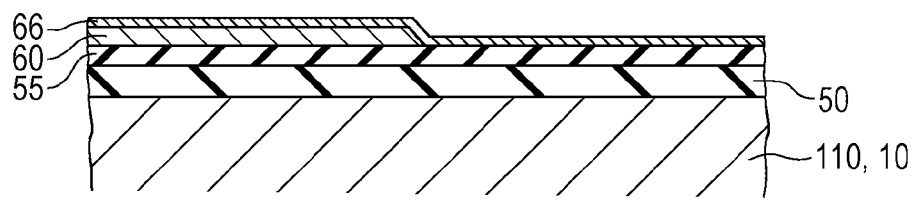
Figure 4D:
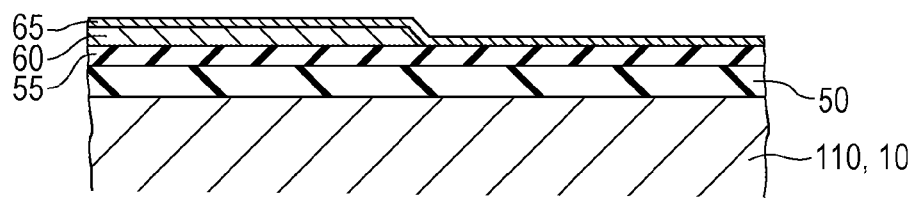

Next, as illustrated in FIG. 4C, after removing the resist, an orientation control layer precursor layer 66, which is a precursor made of a composite oxide having the perovskite structure including Bi in the A site and including Fe and Ti in the B site, is formed on the first electrode 60 (and the insulator layer 55) and then the orientation control layer 65 made of the composite oxide having the perovskite structure is formed by baking the orientation control layer precursor layer 66 (FIG. 4D). As described above, for example, the orientation control layer 65 can be manufactured using a chemical solution method such as Metal-Organic Decomposition (MOD) method or sol-gel method, in which the orientation control layer precursor layer 66 is formed by applying precursor solution containing a metal complex and the orientation control layer 65 made of a metal oxide is obtained by drying the orientation control layer precursor layer 66 and baking at high temperature. In addition, the orientation control layer 65 can also be manufactured using a laser ablation method, a sputtering method, a pulsed laser deposition method (PLD method), CVD method, an aerosol deposition method or the like.

When the orientation control layer 65 is formed using the chemical solution method, as a specific example of a formation procedure, first, as illustrated in FIG. 4C, a composition (precursor solution of the orientation control layer) for forming the orientation control layer made of MOD solution or sol including the metal complex containing Bi, Fe and Ti is applied using a spin coating method or the like and the orientation control layer precursor layer 66 is formed (process of applying the orientation control layer precursor solution).

The precursor solution of a buffer layer to be applied is mixed with the metal complex capable of forming the composite oxide having the perovskite structure including Bi in the A site and including Fe and Ti in the B site by baking, and the mixture is dissolved or dispersed in an organic solvent. As the metal complex containing Bi, Fe, Ti or the like, respectively, for example, alkoxide, organic acid salt, β-diketone complex or the like can be used. As the metal complex containing Bi, for example, 2-ethylhexanoate bismuth, acetate bismuth or the like can be used. As the metal complex containing Fe, for example, 2-ethyhexanoate acid iron, acetate iron, tris(acetylacetonate) iron or the like can be used. As the metal complex containing Ti, for example, 2-ethylhexanoic acid titanium, acetate titanium or the like can be used. In addition, as a solvent of the precursor solution of the orientation control layer, propanol, butanol, pentanol, hexanol, octanol, ethylene glycol, propylene glycol, octane, decane, cyclohexane, xylene, toluene, tetrahydrofuran, acetic acid, octyl acid or the like can be used.

Next, the orientation control layer precursor layer 66 is heated at a predetermined temperature (for example, 150° C. to 200° C.) and is dried for a certain period of time (process of drying the orientation control layer). Next, the orientation control layer precursor layer 66 which is dried is degreased by heating at a predetermined temperature (for example, 350° C. to 450° C.) and by being retained for a certain period of time (process of degreasing the orientation control layer). The degreasing used herein is, for example, that organic components contained in the orientation control layer precursor layer 66 are detached using $NO_2$, $CO_2$, $H_2O$ or the like. Ambience of the process of drying the orientation control layer or the process of degreasing the orientation control layer is not limited and the ambience may be the atmosphere, oxygen ambient or inert gas.

Next, as illustrated in FIG. 4D, the orientation control layer precursor layer 66 is crystallized by heating at a predetermined temperature, for example, at approximately 600° C. to 850° C. and by retaining for a certain period of time, for example, for 1 minute to 10 minutes, and the orientation control layer 65 made of the composite oxide having the perovskite structure including Bi in the A site and including Fe and Ti in the B site is formed (baking process).

Ambience of the process of baking the orientation control layer also is not limited and the ambience may be the atmosphere, the oxygen ambient or the inert gas. As a heating device used for the process of drying the orientation control layer, the process of degreasing the orientation control layer and the process of baking the orientation control layer, for example, Rapid Thermal Annealing (RTA) device in which heating is performed by irradiation with an infrared lamp, a hot plate or the like can be used.

In the embodiment, the orientation control layer 65 made of one layer is formed with the applying process one time; however, the orientation control layer 65 made of a plurality of layers may be formed by repeating the process of applying the orientation control layer, the process of drying the orientation control layer and the process of degreasing the orientation control layer, or the process of applying the orientation control layer, the process of drying the orientation control layer, the process of degreasing the orientation control layer and process of baking the orientation control layer several times as described above, depending on a desired film thickness. However, it is preferable that the orientation control layer 65 be thin so as not to reduce the displacement characteristics of a piezoelectric body film 72 and the thickness thereof is preferably 20 nm to 80 nm, and is further preferably 20 nm to 50 nm.

Next, the piezoelectric body layer 70 made of the composite oxide having the perovskite structure is formed on the orientation control layer 65. For example, the piezoelectric body layer 70 can be manufactured by applying drying and degreasing the solution containing the metal complex. In addition, the piezoelectric body layer 70 can also be manufactured using a laser ablation method, a sputtering method, a pulsed laser deposition method (PLD method), CVD method, an aerosol deposition method or the like.

Figure 5A:
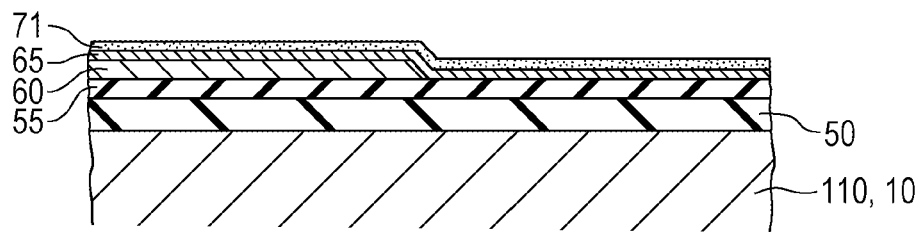
FIGS. 5A to 5C are cross-sectional views illustrating the process of manufacturing the recording head according to the embodiment 1.

For example, first, as illustrated in FIG. 5A, the sol or the MOD solution (precursor solution) including the organic metal complex containing configuration metals of the piezoelectric material that is the piezoelectric body layer 70 is applied using the spin coating method and then a piezoelectric body precursor film 71 is formed on the orientation control layer 65 (applying process).

For example, the precursor solution to be applied is mixed with each organic metal complex including the configuration metals of the piezoelectric material that are the piezoelectric body layer 70 so that each configuration metal has a desired mole ratio, and the mixture is dissolved or dispersed using the organic solvent such as alcohol. As the organic metal complex containing the configuration metals of the piezoelectric material, for example, metal alkoxide, organic acid salt, β-diketone complex or the like can be used. Specifically, for example, the following materials can be used. As the organic metal complex containing lead (Pb), for example, lead acetate or the like can be used. As the organic metal complex containing zirconium (Zr), for example, zirconium acetylacetonate, zirconium tetraacetylacetonate, mono zirconium acetylacetonate, zirconium bisacetylacetonate or the like can be used. As the organic metal complex containing titanium (Ti), for example, titanium alkoxide, titanium isopropoxide or the like can be used.

Next, the piezoelectric body precursor film 71 is heated in a predetermined temperature, for example, approximately 130° C. to 180° C. and is dried for a certain period of time (drying process). Next, the piezoelectric body precursor film 71 which is dried is degreased by heating at a predetermined temperature, for example, 300° C. to 400° C. and by retaining for a certain period of time (degreasing process). In addition, the degreasing used herein is that the organic components contained in the piezoelectric body precursor film 71 are detached using $NO_2$, $CO_2$, $H_2O$ or the like.

Figure 5B:
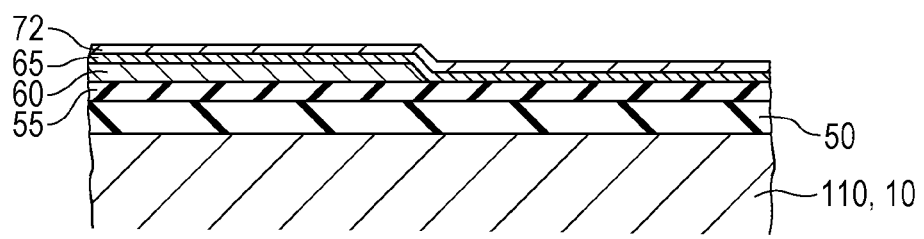

Next, as illustrated in FIG. 5B, the piezoelectric body precursor film 71 is crystallized by heating at a predetermined temperature, for example, at approximately 650° C. to 800° C. and by retaining for a certain period of time, and the piezoelectric body film 72 is formed (baking process). As the heating device used for the drying process, the degreasing process and the baking process, for example, Rapid Thermal Annealing (RTA) device in which heating is performed by irradiation of the infrared lamp, the hot plate or the like can be used.

In addition, the piezoelectric body layer made of a piezoelectric body film having a plurality of layers may be formed by repeating the applying process, the drying process and the degreasing process, or the applying process, the drying process, the degreasing process and the baking process several times as described above, depending on a desired film thickness.

Figure 5C:
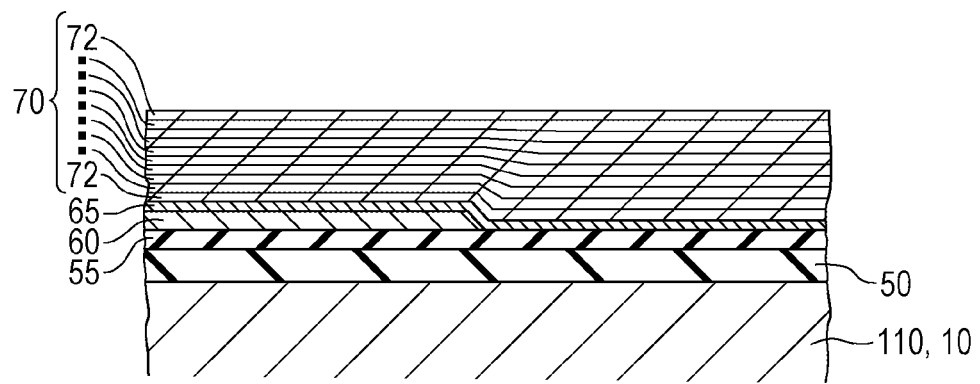

Next, the piezoelectric body layer 70 made of piezoelectric body films 72 having the plurality of layers is formed by repeating the applying process, the drying process and the degreasing process, or the applying process, the drying process, the degreasing process and baking process several times as described above, depending on a desired film thickness so that as illustrated in FIG. 5C, the piezoelectric body layer 70 having a predetermined thickness made of the piezoelectric body film 72 having the plurality of layers is formed. For example, when the thickness which is formed per one time of the application solution is approximately 0.1 μm, the film thickness of the entire piezoelectric body layer 70 made of the piezoelectric body film 72 of ten layers is approximately 1.1 μm. In addition, in the embodiment, the piezoelectric body film 72 is formed by laminating a plurality of layers; however, the piezoelectric body film 72 may have only one layer.

As described above, the orientation of the piezoelectric body layer 70 is controlled with the orientation control layer 65 by forming the piezoelectric body layer 70 on the orientation control layer 65 made of the composite oxide having the perovskite structure including Bi in the predetermined A site and including Fe and Ti in the B site, and the piezoelectric body layer 70 which is preferentially oriented in the (100) plane can be made.

Figure 6A:
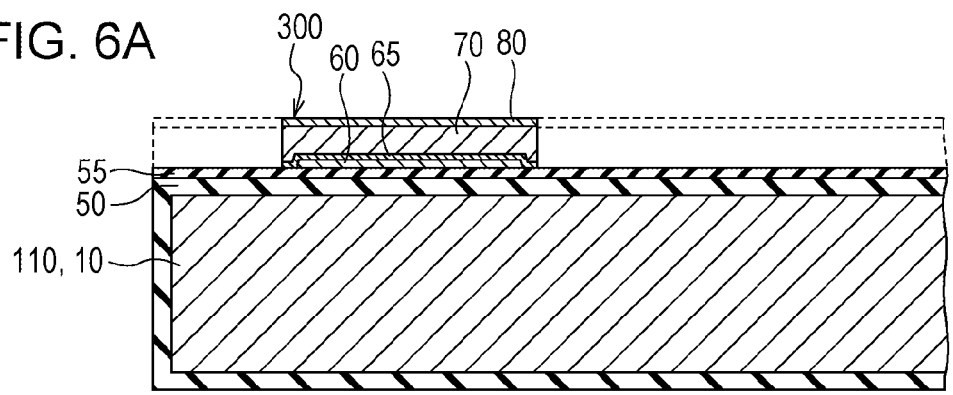
FIGS. 6A to 6C are cross-sectional views illustrating the process of manufacturing the recording head according to the embodiment 1.

As illustrated in FIG. 6A, after forming the piezoelectric body layer 70, for example, the second electrode 80 made of a metal such as platinum is laminated on the piezoelectric body layer 70 and the piezoelectric element 300 is formed by patterning the piezoelectric body layer 70 and the second electrode 80 at the same time. In addition, the patterning of the piezoelectric body layer 70 and the second electrode 80 can be collectively performed by dry etching through a resist (not illustrated) formed in a predetermined shape. After that, if necessary, post-annealing may be performed in a temperature range of 600° C. to 800° C. Therefore, a good interface of the piezoelectric body layer 70 and the first electrode 60 or the second electrode 80 can be formed, and the crystalline of the piezoelectric body layer 70 can be improved.

Figure 6B:
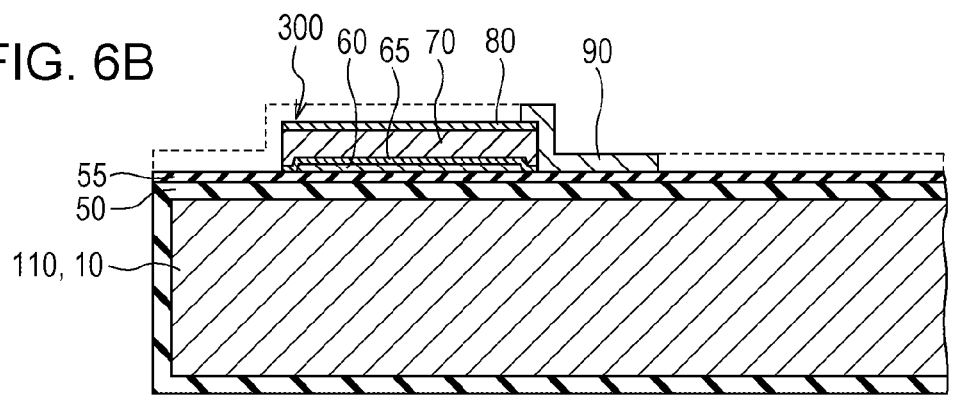

Next, as illustrated in FIG. 6B, for example, after the lead electrode 90 made of gold (Au) or the like forming throughout an entire flow path forming substrate wafer 110, for example, the patterning is performed for each piezoelectric element 300 through a mask pattern (not illustrated) made of the resist or the like.

Figure 6C:
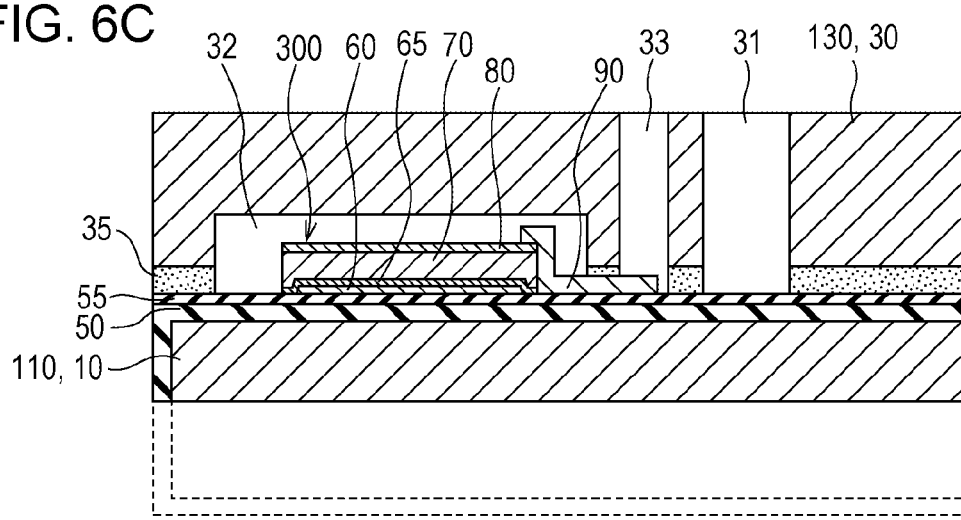

Next, as illustrated in FIG. 6C, after a protective substrate wafer 130 made of a plurality of protective substrates 30, which is a silicon wafer, is bonded on the piezoelectric element 300 side of the flow path forming substrate wafer 110 through the adhesive 35, the flow path forming substrate wafer 110 is thinned to a predetermined thickness.

Next, even though not illustrated, a mask film is newly formed on the flow path forming substrate wafer 110 and the patterning is performed in a predetermined shape. Then, the pressure generation chamber 12 corresponding to the piezoelectric element 300, the communication section 13, the ink supply path 14, the communication path 15 or the like is formed by anisotropic etching (wet etching) the flow path forming substrate wafer 110 using alkaline solution such as KOH through the mask film.

After that, an unnecessary portion of the outer peripheral edge of the flow path forming substrate wafer 110 and the protective substrate wafer 130 is removed, for example, by cutting with dicing or the like. Then, after the mask film of a surface of the flow path forming substrate wafer 110 opposite to the protective substrate wafer 130 is removed, the nozzle plate 20 through which the nozzle opening 21 is bored is bonded to the protective substrate wafer 130 and the compliance substrate 40 is bonded thereto and then as illustrated in FIG. 1, the ink jet type recording head I of the embodiment is formed by dividing the flow path forming substrate wafer 110 into the flow path forming substrate 10 of one chip size.

In the embodiment, it is possible to form the piezoelectric body layer 70 in which the ground is preferentially oriented in the (100) plane in the region of the first electrode 60 and also in the region of the insulator layer 55 by forming the piezoelectric body layer 70 on the orientation control layer 65 made of the composite oxide having the perovskite structure including Bi in the A site and including Fe and Ti in the B site, without being affected by the ground.

Hereinafter, embodiments will be illustrated and the invention will be further described in detail. In addition, the invention is not limited to the following embodiments.

Embodiments

Embodiment 1

Preparation of Substrate

First, a silicon dioxide film having a film thickness of 1170 nm was formed by performing thermal oxidation on a surface of a single crystal silicon substrate oriented in (110). Next, a titanium film having a film thickness of 20 nm was formed on the silicon dioxide film using a RF magnetron sputtering method, and the titanium oxide film was formed by performing thermal oxidation. Next, a substrate having electrodes was made by forming the first electrode 60 made of a platinum film having a film thickness of 130 nm on the titanium oxide film using the RF magnetron sputtering method.

Orientation Control Layer

Each n-octane solution of 2-ethylhexanoic acid bismuth, 2-ethylhexanoic acid iron and 2-ethylhexanoic acid titanium was mixed, and the orientation control layer precursor solution was prepared by mixing the solutions in which a mole ratio of Bi:Fe:Ti was 100:40:60.

After the orientation control layer precursor solution was deposited on the substrate having the electrodes using a spin coater, the substrate was baked on a hot plate in 180° C.×3 min and 350° C.×3 min, and an amorphous film was formed. Next, the amorphous film was baked in 700° C.×5 min using a lamp annealing furnace and the orientation control layer having a thickness of 80 nm was formed.

Piezoelectric Body Layer

In order to form the piezoelectric body layer made of the composite oxide having the perovskite structure including Bi, Ba, Fe, Mn and Ti, each n-octane solution of 2-ethylhexanoic acid bismuth, 2-ethylhexanoic acid barium, 2-ethylhexanoic acid iron, 2-ethylhexanoic acid manganese and 2-ethylhexanoic acid titanium was mixed and the piezoelectric body layer precursor solution made of BFM-BT was prepared by mixing the solutions so that a mole ratio of Bi:Ba;Fe:Mn:Ti was Bi:Ba;Fe:Mn:Ti=75.0:25.0:71.3:3.8:25.0.

An appropriate amount of the piezoelectric body layer precursor solution was taken using a micropipette and the solution was dropped on the orientation control layer of the substrate which was set to the spin coater. After being deposited with the spin coater, the substrate was baked on the hot plate in 180° C.×3 min and 350° C.×3 min, and the amorphous film was formed. The amorphous film was baked in 750° C.×5 min using the lamp annealing furnace and the first piezoelectric body film was formed.

Similarly, in order to further manufacture the piezoelectric body film, an appropriate amount of the piezoelectric body layer precursor solution was taken using the micropipette and the solution was dropped on the substrate which was set to the spin coater. After being deposited with the spin coater, the substrate was baked on the hot plate in 180° C.×3 min and 350° C.×3 min and an amorphous film is formed. After repeating the work two times, a crystal film is made by baking the film in 750° C.×5 min using the lamp annealing furnace. The process to the lamp annealing furnace was repeated five times and the piezoelectric body layer made of the piezoelectric body film of eleven layers having a thickness of 900 nm was formed. The second electrode made of iridium was formed on the piezoelectric body layer using the sputtering method.

Embodiment 2

The embodiment 2 was the same as the embodiment 1 except that the orientation control layer precursor solution was used in which the mole ratio of Bi:Fe:Ti was 100:50:50.

Embodiment 3

The embodiment 3 was the same as the embodiment 1 except that the orientation control layer precursor solution was used in which the mole ratio of Bi:Fe:Ti was 100:60:40.

Embodiment 4

The embodiment 4 was the same as the embodiment 1 except that the orientation control layer precursor solution was used in which the mole ratio of Bi:Fe:Ti was 100:50:50, and the film thickness of the orientation control layer was 60 nm.

Embodiment 5

The embodiment 5 was the same as the embodiment 1 except that the orientation control layer precursor solution was used in which the mole ratio of Bi:Fe:Ti was 100:50:50, and the film thickness of the orientation control layer was 40 nm.

Embodiment 6

The embodiment 6 was the same as the embodiment 1 except that the orientation control layer precursor solution was used in which the mole ratio of Bi:Fe:Ti was 100:50:50, and the film thickness of the orientation control layer was 30 nm.

Embodiment 7

The embodiment 7 was the same as the embodiment 1 except that the orientation control layer precursor solution was used in which the mole ratio of Bi:Fe:Ti was 100:50:50, and the film thickness of the orientation control layer was 20 nm.

Embodiment 8

The embodiment 8 was the same as the embodiment 1 except that the orientation control layer precursor solution was used in which the mole ratio of Bi:Fe:Ti was 105:50:50, and the film thickness of the orientation control layer was 40 nm.

Embodiment 9

The embodiment 9 was the same as the embodiment 1 except that the orientation control layer precursor solution was used in which the mole ratio of Bi:Fe:Ti was 110:50:50, and the film thickness of the orientation control layer was 40 nm.

Embodiment 10

The embodiment 10 was the same as the embodiment 1 except that the orientation control layer precursor solution was used in which the mole ratio of Bi:Fe:Ti was 115:50:50, and the film thickness of the orientation control layer was 40 nm.

Embodiment 11

The embodiment 11 was the same as the embodiment 1 except that the orientation control layer precursor solution was used in which the mole ratio of Bi:Fe:Ti was 105:50:50, and the film thickness of the orientation control layer was 20 nm.

Embodiment 12

The embodiment 12 was the same as the embodiment 1 except that the orientation control layer precursor solution was used in which the mole ratio of Bi:Fe:Ti was 110:50:50, and the film thickness of the orientation control layer was 20 nm.

Embodiment 13

The embodiment 13 was the same as the embodiment 1 except that the orientation control layer precursor solution was used in which the mole ratio of Bi:Fe:Ti was 115:50:50, and the film thickness of the orientation control layer was 20 nm.

Embodiment 14

The embodiment 14 was the same as the embodiment 1 except that the substrate having the electrodes was used in which the first electrode was an Ir electrode, the orientation control layer precursor solution was used in which the mole ratio of Bi:Fe:Ti was 115:50:50, and the film thickness of the orientation control layer was 60 nm.

Embodiment 15

The embodiment 15 was the same as the embodiment 1 except that the substrate having the electrodes was used in which the first electrode was the Ir electrode, the orientation control layer precursor solution was used in which the mole ratio of Bi:Fe:Ti was 115:50:50, and the film thickness of the orientation control layer was 40 nm.

Embodiment 16

The embodiment 16 was the same as the embodiment 1 except that the substrate having the electrodes was used in which the first electrode was the Ir electrode, the orientation control layer precursor solution was used in which the mole ratio of Bi:Fe:Ti was 115:50:50, and the film thickness of the orientation control layer was 30 nm.

Embodiment 17

The embodiment 17 was the same as the embodiment 1 except that the substrate of the insulator layer made of the silicon oxide film and zirconium oxide was used without providing the first electrode and the second electrode, the orientation control layer precursor solution was used in which the mole ratio of Bi:Fe:Ti was 100:50:50, and the film thickness of the orientation control layer was 40 nm.

Embodiment 18

The embodiment 18 was the same as the embodiment 1 except that the substrate of the insulator layer made of the silicon oxide film and zirconium oxide was used without providing the first electrode and the second electrode, the orientation control layer precursor solution was used in which the mole ratio of Bi:Fe:Ti was 115:50:50, and the film thickness of the orientation control layer was 80 nm.

Embodiment 19

The embodiment 19 was the same as the embodiment 1 except that the orientation control layer precursor solution was used in which the mole ratio of Bi:Fe:Ti was 115:50:50, and the film thickness of the orientation control layer was 60 nm.

Embodiment 20

The embodiment 20 was the same as the embodiment 1 except that the orientation control layer precursor solution was used in which the mole ratio of Bi:Fe:Ti was 115:50:50, and the film thickness of the orientation control layer was 40 nm.

Embodiment 21

The embodiment 21 was the same as the embodiment 1 except that the orientation control layer precursor solution was used in which the mole ratio of Bi:Fe:Ti was 115:50:50, and the film thickness of the orientation control layer was 20 nm.

Embodiment 22

First, the PZT precursor solution was obtained by mixing lead acetate trihydrate ($Pb(CH_3COO)_2 \cdot 3H_2O$), titanium isopropoxide ($Ti[OCH(CH_3)_2]_4$) and zirconium acetylacetonate ($Zr(CH_3COChCOCH_3)_4$) as main materials, butyl cellosolve ($C_6H_{14}O_6$) as a solvent, diethanolamine ($C_4H_{11}NO_2$) as a stabilizer, and polyethylene glycol ($C_2H_6O_6$) as a thickener. In addition, the precursor solution was mixed in a ratio of lead acetate trihydrate:titanium isopropoxide:zirconium acetylacetonate:butyl cellosolve:diethanolamine:polyethylene glycol=1.1:0.44:0.56:3:0.65:0.5 (mole ratio). Furthermore, lead acetate trihydrate was added in excess of 10% in consideration of loss due to evaporation.

The embodiment 22 was the same as the embodiment 1 except that the orientation control layer precursor solution was used in which the mole ratio of Bi:Fe:Ti was 100:50:50, the film thickness of the orientation control layer was 60 nm, and the thickness thereof was 900 nm using the PZT precursor solution.

Embodiment 23

The embodiment 23 was the same as the embodiment 22 except that the orientation control layer precursor solution was used in which the mole ratio of Bi:Fe:Ti was 115:50:50, and the film thickness of the orientation control layer was 60 nm.

Embodiment 24

The embodiment 24 was the same as the embodiment 22 except that the orientation control layer precursor solution was used in which the mole ratio of Bi:Fe:Ti was 115:50:50, and the film thickness of the orientation control layer was 40 nm.

Embodiment 25

The embodiment 25 was the same as the embodiment 22 except that the orientation control layer precursor solution was used in which the mole ratio of Bi:Fe:Ti was 115:50:50, and the film thickness of the orientation control layer was 30 nm.

Embodiment 26

The embodiment 26 was the same as the embodiment 22 except that the orientation control layer precursor solution was used in which the mole ratio of Bi:Fe:Ti was 115:50:50, and the film thickness of the orientation control layer was 20 nm.

Comparison Example 1

The comparison example 1 is the same as the embodiment 1 except that the piezoelectric body layer was formed without providing the orientation control layer.

Test Example 1

An X-ray diffraction chart of each embodiment was obtained by using "D8 DiscoverWith GADDS; small area X-ray diffractometer" of Bruker AXS Inc., using $CuK\alpha$ ray as an X-ray source at a room temperature before the second electrode is formed. The X-ray diffraction pattern of each embodiment is illustrated in FIGS. 7 to 15.

Figure 16:
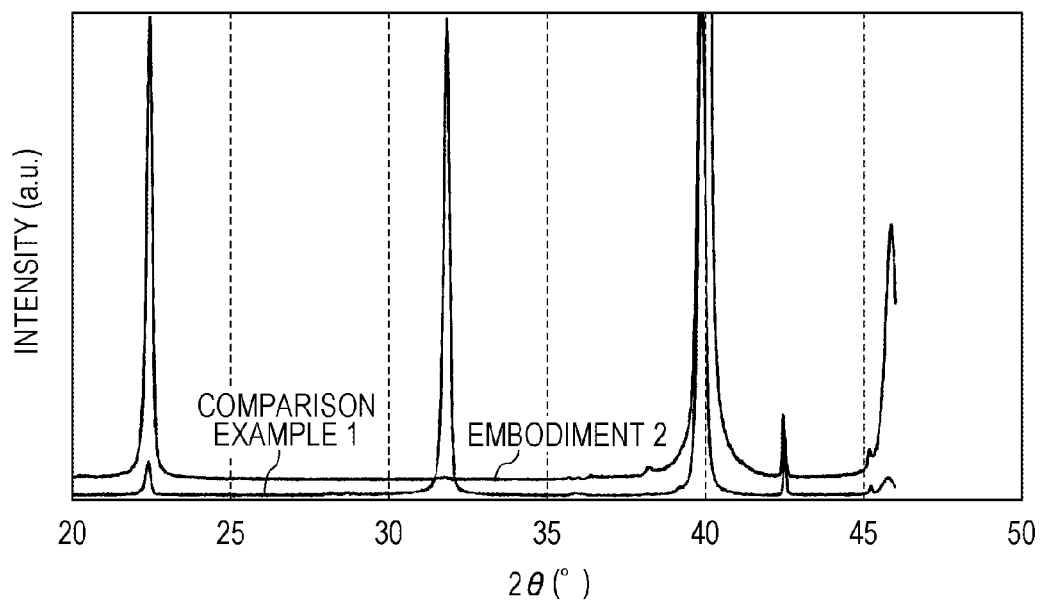
FIG. 16 is a view illustrating X-ray diffraction patterns of an embodiment 2 and a comparison example 1.

In addition, the X-ray diffraction patterns of the embodiment 2 and the comparison example 1 are illustrated in FIG. 16.

Here, a peak in the vicinity of $2\theta=22.5°$ is the peak derived from the (100) plane and a peak in the vicinity of $2\theta=31.8°$ is the peak derived from (110) plane.

(100)/[(100)+(110)] was obtained from a ratio of the peak intensity and was a (100) plane orientation rate. Results thereof are illustrated in Table 1.

First, as illustrated in FIG. 16, the piezoelectric body layer made of the BFM-BT had an extremely small peak in the (100) plane orientation compared to the peak of the (110) plane orientation without the orientation control layer and is substantially completely oriented in (100) plane in the embodiment 2 in which the orientation control layer was provided even though in the (110) plane orientation.

Figure 7:
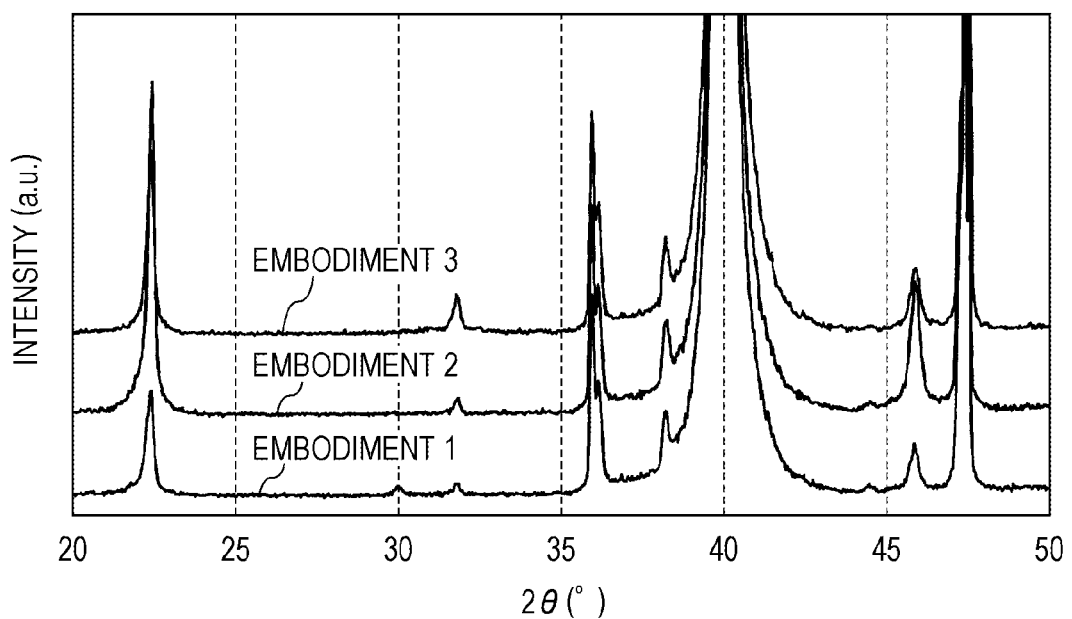
FIG. 7 is a view illustrating X-ray diffraction patterns of embodiments.

In addition, it was confirmed that the piezoelectric body layer made of The BFM-BT could be preferentially oriented in (100) plane in a range of Bi:Fe:Ti=100:40:60 to Bi:Fe:Ti=100:60:40 in the compositions of the orientation control layer from the results of the embodiments 1 to 3 illustrated in FIG. 7.

Figure 8:
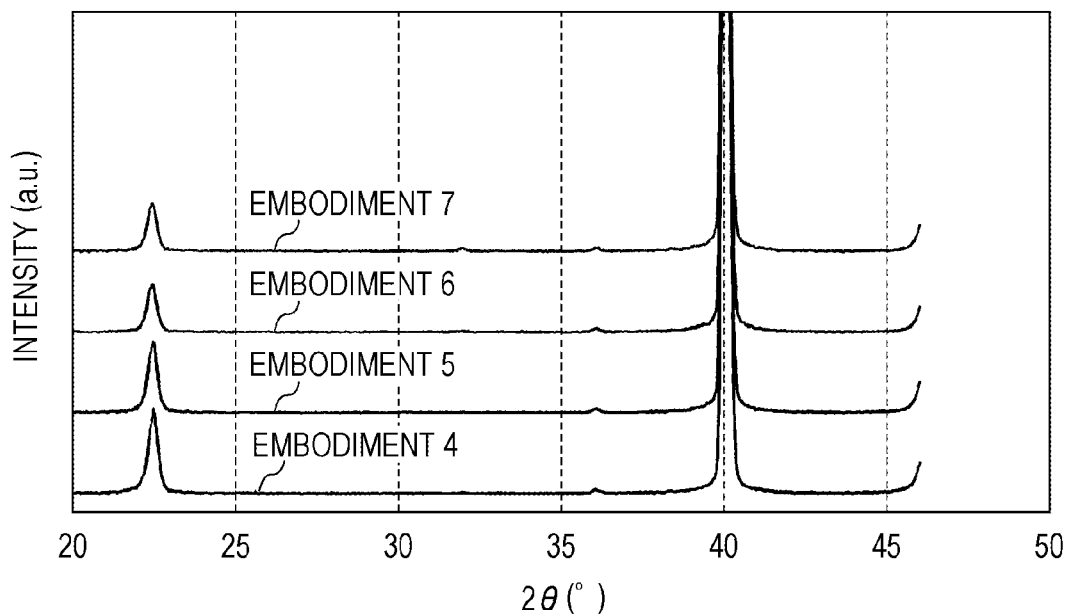
FIG. 8 is a view illustrating X-ray diffraction patterns of embodiments.

In addition, it was confirmed that the orientation control function was exhibited even though the thickness of the orientation control layer was 20 nm to 80 nm from the results of the embodiments 1 to 3 illustrated in FIG. 7 and the embodiments 4 to 7 illustrated in FIG. 8.

Figure 9:
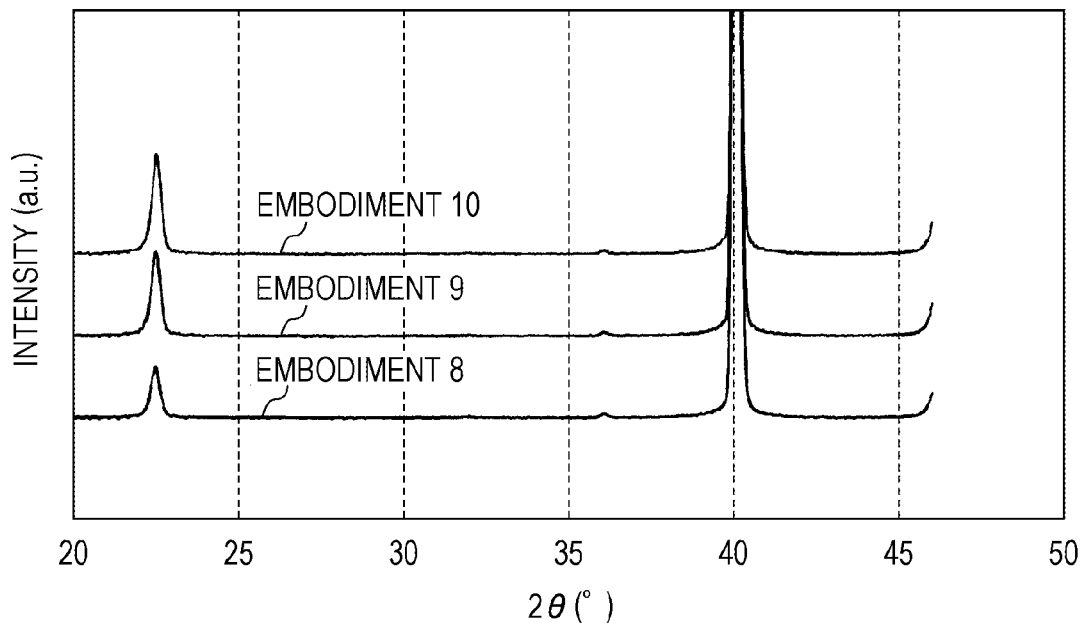
FIG. 9 is a view illustrating X-ray diffraction patterns of embodiments.
Figure 10:
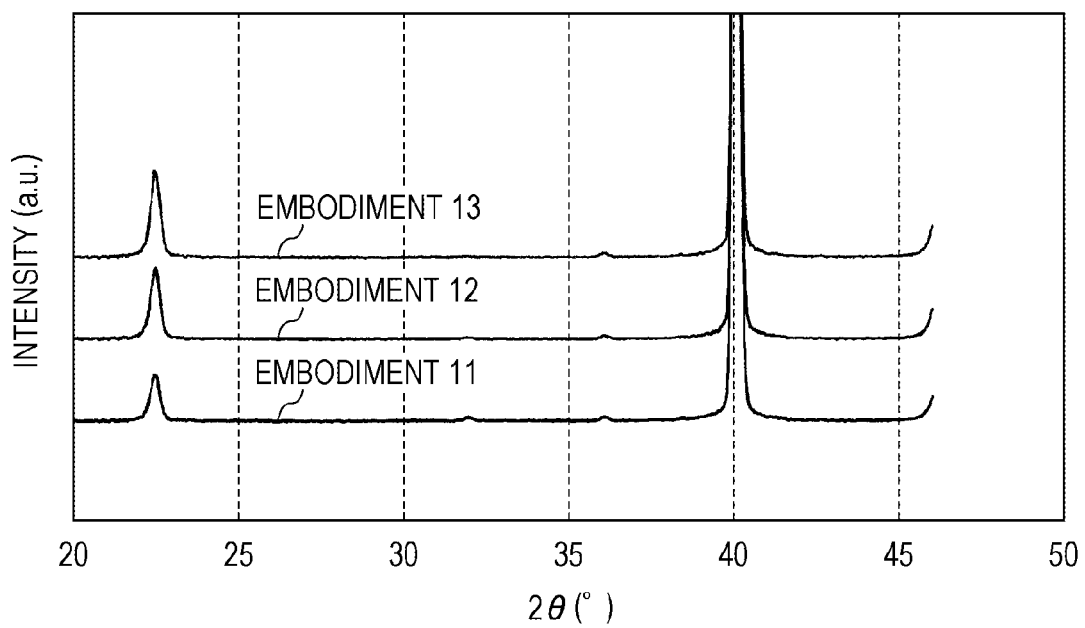
FIG. 10 is a view illustrating X-ray diffraction patterns of embodiments.

In addition, it was confirmed that the orientation control layer could function similar to the orientation control layer of the embodiment 5 in which Bi is not in excess, even though the orientation control layer had the composition in excess of 5% to 15% in Bi and had the thickness of 40 nm and 20 nm from the results of the embodiments 8 to 13 illustrated in FIGS. 9 and 10.

Figure 11:
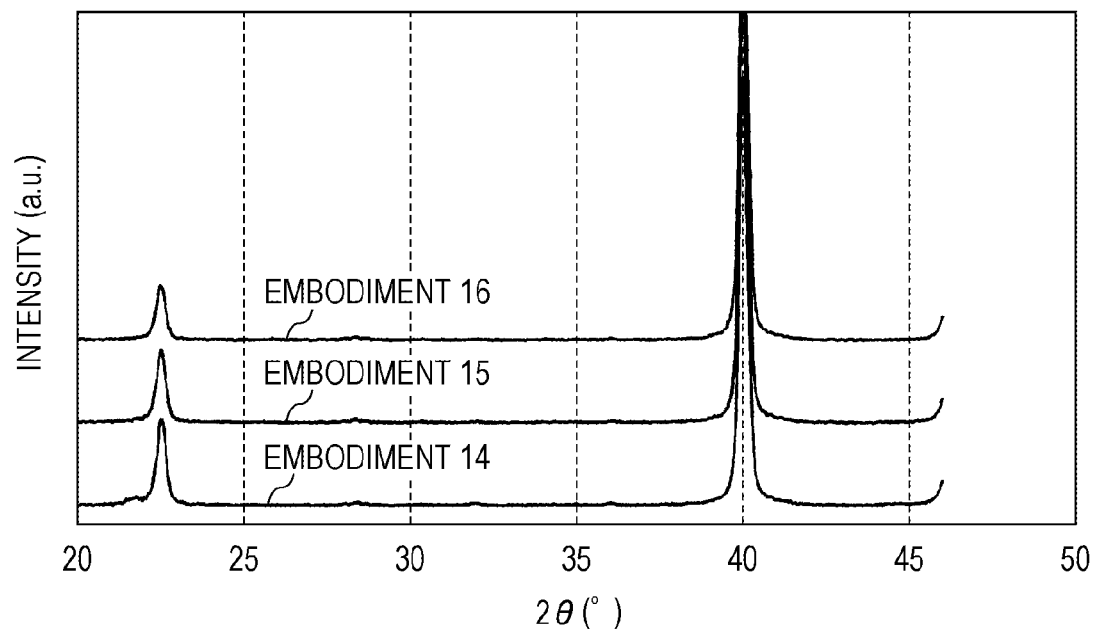
FIG. 11 is a view illustrating X-ray diffraction patterns of embodiments.

In addition, it was confirmed that the orientation of the BFM-BT piezoelectric body layer was controlled even though the ground was Ir without Pt from the results of the embodiments 14 to 16 illustrated in FIG. 11.

Figure 12:
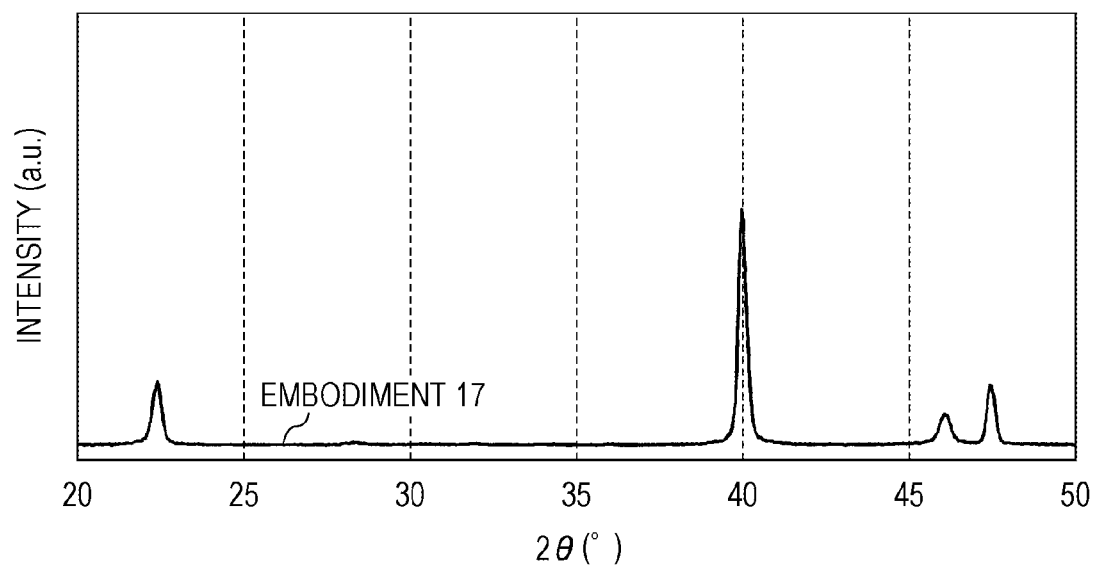
FIG. 12 is a view illustrating an X-ray diffraction pattern of an embodiment.
Figure 13:
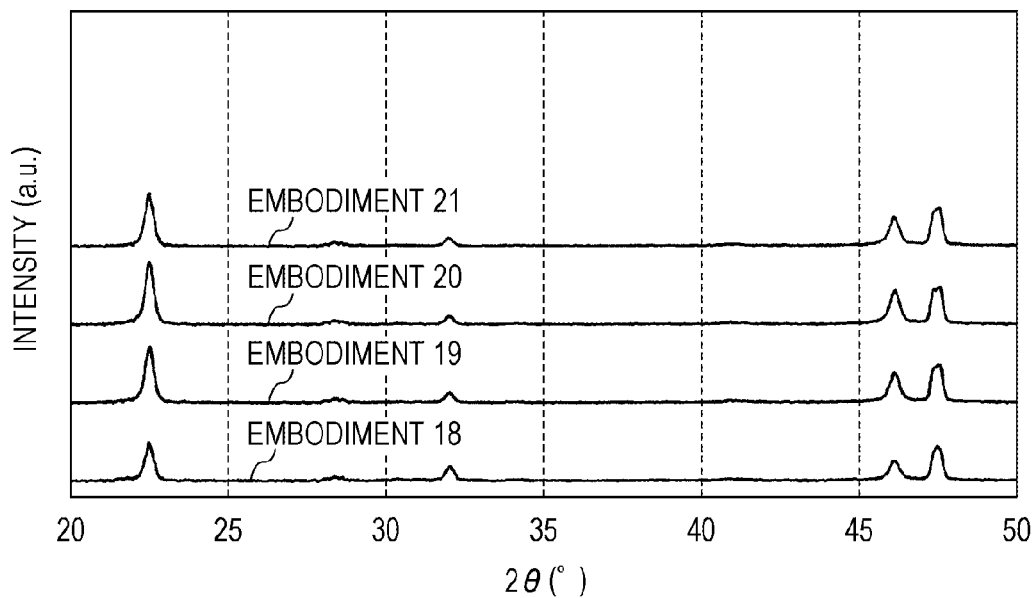
FIG. 13 is a view illustrating X-ray diffraction patterns of embodiments.

In addition, it was confirmed that the BFM-BT piezoelectric body layer could be preferentially oriented in (100) plane even though the ground was zirconium oxide from the results of the embodiments 17 to 21 illustrated in FIGS. 12 and 13.

Figure 14:
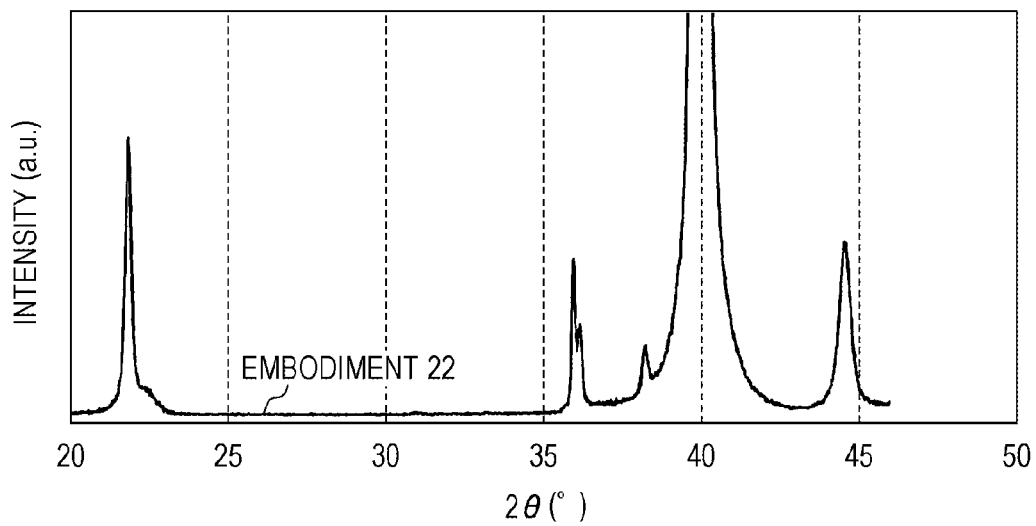
FIG. 14 is a view illustrating an X-ray diffraction pattern of an embodiment.
Figure 15:
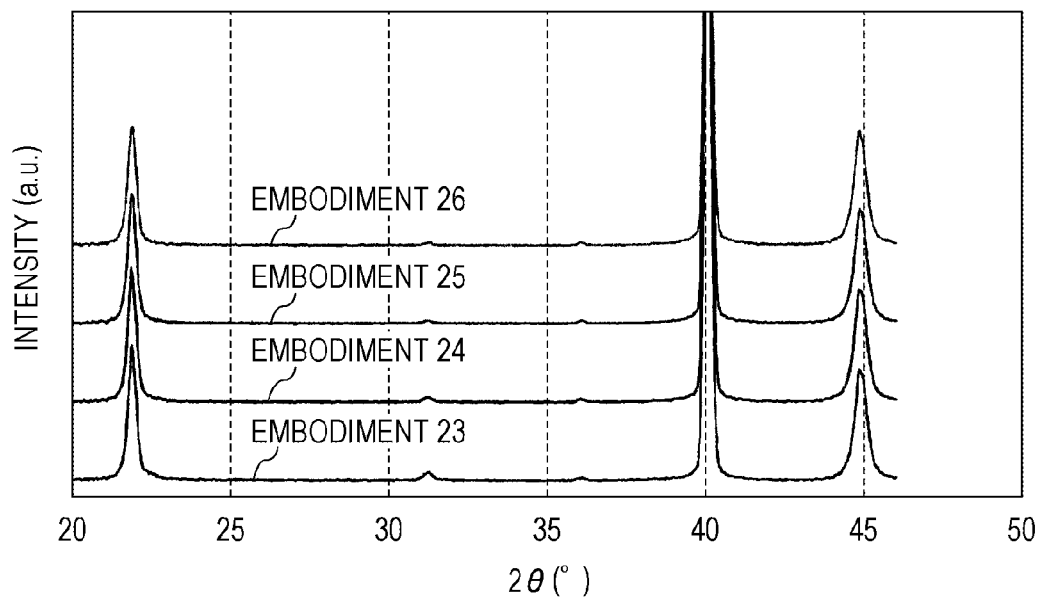
FIG. 15 is a view illustrating X-ray diffraction patterns of embodiments.

In addition, it was confirmed that the orientation of the PZT piezoelectric body layer could also be preferentially oriented in (100) plane from the results of the embodiments 22 to 26 illustrated in FIGS. 14 and 15.

TABLE 1

| | Seed composition (Bi/Fe/Ti) | Film thickness of orientation control layer (nm) | Substrate (surface layer) | Piezoelectric material | Orientation | Orientation rate (%) |
|---|---|---|---|---|---|---|
| Embodiment 1 | 100/40/60 | 80 | Pt | BFM-BT | (100) | 87 |
| Embodiment 2 | 100/50/50 | 80 | Pt | BFM-BT | (100) | 94 |
| Embodiment 3 | 100/60/40 | 80 | Pt | BFM-BT | (100) | 81 |
| Embodiment 4 | 100/50/50 | 60 | Pt | BFM-BT | (100) | 97 |

TABLE 1-continued

| | Seed composition (Bi/Fe/Ti) | Film thickness of orientation control layer (nm) | Substrate (surface layer) | Piezoelectric material | Orientation | Orientation rate (%) |
|---|---|---|---|---|---|---|
| Embodiment 5 | 100/50/50 | 40 | Pt | BFM-BT | (100) | 97 |
| Embodiment 6 | 100/50/50 | 30 | Pt | BFM-BT | (100) | 94 |
| Embodiment 7 | 100/50/50 | 20 | Pt | BFM-BT | (100) | 92 |
| Embodiment 8 | 105/50/50 | 40 | Pt | BFM-BT | (100) | 94 |
| Embodiment 9 | 110/50/50 | 40 | Pt | BFM-BT | (100) | 97 |
| Embodiment 10 | 115/50/50 | 40 | Pt | BFM-BT | (100) | 97 |
| Embodiment 11 | 105/50/50 | 20 | Pt | BFM-BT | (100) | 91 |
| Embodiment 12 | 110/50/50 | 20 | Pt | BFM-BT | (100) | 96 |
| Embodiment 13 | 115/50/50 | 20 | Pt | BFM-BT | (100) | 97 |
| Embodiment 14 | 115/50/50 | 60 | Ir | BFM-BT | (100) | 96 |
| Embodiment 15 | 115/50/50 | 40 | Ir | BFM-BT | (100) | 96 |
| Embodiment 16 | 115/50/50 | 30 | Ir | BFM-BT | (100) | 95 |
| Embodiment 17 | 100/50/50 | 40 | $ZrO_2$ | BFM-BT | (100) | 96 |
| Embodiment 18 | 115/50/50 | 80 | $ZrO_2$ | BFM-BT | (100) | 71 |
| Embodiment 19 | 115/50/50 | 60 | $ZrO_2$ | BFM-BT | (100) | 83 |
| Embodiment 20 | 115/50/50 | 40 | $ZrO_2$ | BFM-BT | (100) | 87 |
| Embodiment 21 | 115/50/50 | 20 | $ZrO_2$ | BFM-BT | (100) | 85 |
| Embodiment 22 | 100/50/50 | 60 | Pt | PZT | (100) | 99 |
| Embodiment 23 | 115/50/50 | 60 | Pt | PZT | (100) | 94 |
| Embodiment 24 | 115/50/50 | 40 | Pt | PZT | (100) | 96 |
| Embodiment 25 | 115/50/50 | 30 | Pt | PZT | (100) | 97 |
| Embodiment 26 | 115/50/50 | 20 | Pt | PZT | (100) | 97 |

Other Embodiments

The foregoing describes one embodiment of the invention; however, the invention is not limited to the above description. For example, as the flow path forming substrate 10, the single crystal silicon substrate is exemplified; however, the flow path forming substrate 10 is not specifically limited to the embodiment and a material such as SOI substrate and glass may be used.

Figure 17:
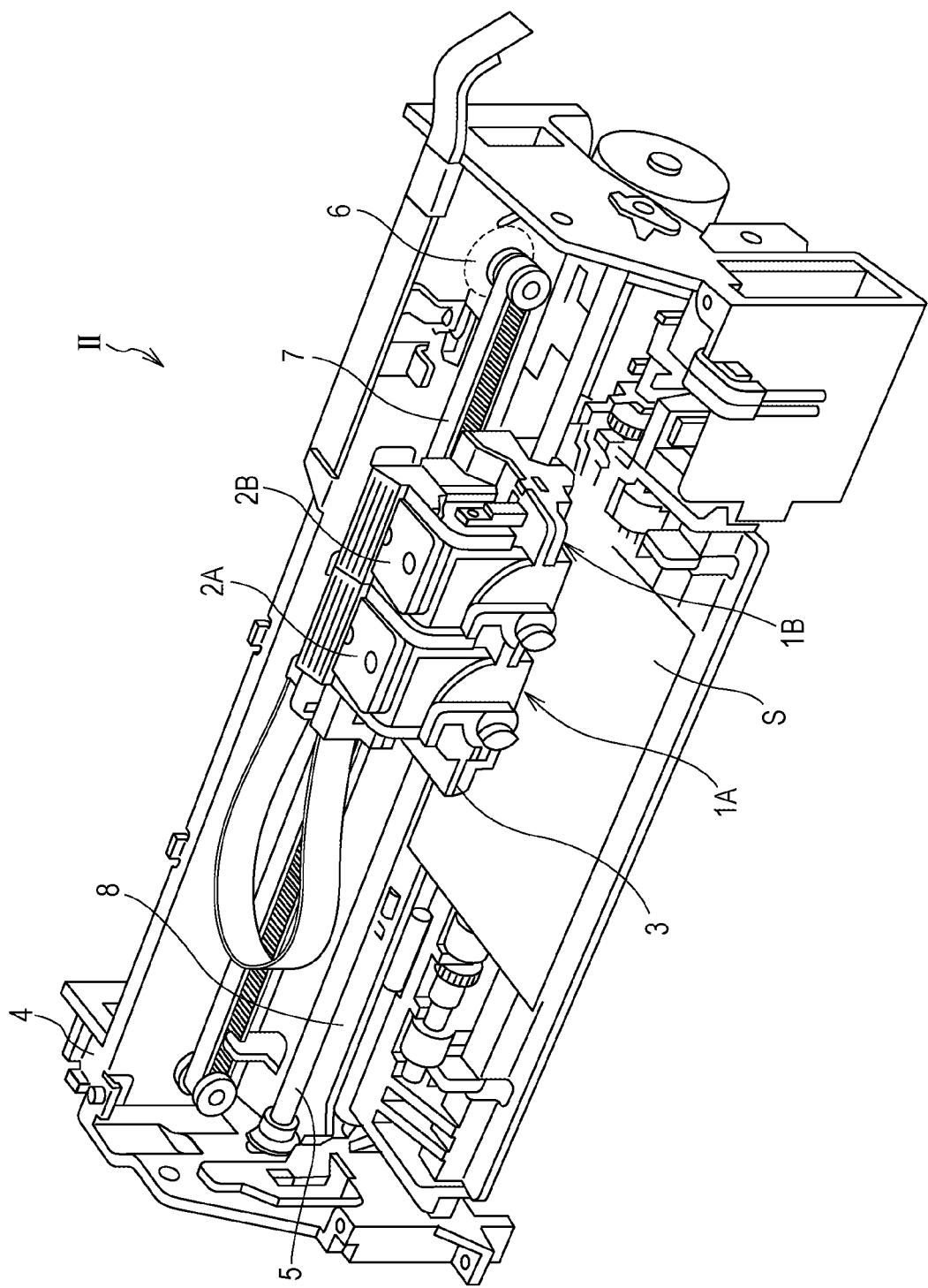
FIG. 17 is a view illustrating a schematic configuration of a recording apparatus according to an embodiment of the invention.

The ink jet type recording head of the embodiments configures a part of the recording head unit including the ink flow path communicating with an ink cartridge or the like and then is mounted on an ink jet type recording apparatus. FIG. 17 is a schematic view illustrating an example of the ink jet type recording apparatus.

In an ink jet type recording apparatus II illustrated in FIG. 17, cartridges 2A and 2B configuring the ink supply unit are detachably provided in recording head units 1A and 1B having the ink jet type recording head I, and a carriage 3 having the recording head units 1A and 1B is movably provided in the axial direction on a carriage shaft 5 which is installed on an apparatus body 4. The recording head units 1A and 1B eject, for example, black ink composition and color ink composition, respectively.

Then, since a driving force of a driving motor 6 is transmitted to the carriage 3 through a plurality of gears (not illustrated) and a timing belt 7, the carriage 3 having the recording head units 1A and 1B is moved along the carriage shaft 5. On the other hand, a platen 8 is provided on the apparatus body 4 along the carriage shaft 5. A recording sheet S that is a recording medium such as a paper fed by a feeding roller (not illustrated) is wound on the platen 8 and transported.

In addition, in the embodiments described above, the invention is described in which the ink jet type recording head as an example of the liquid ejecting head is exemplified; however, the invention is intended for a wide use in general liquid ejecting heads and can be applied, of course, to the liquid ejecting head which ejects liquid other than the ink. As other liquid ejecting heads, for example, various types of recording heads used in the image recording apparatus such as the printer, a color material ejecting head used in manufacturing a color filter of a liquid crystal display or the like, an electrode material ejecting head used in electrode formation of organic EL display, field emission display (FED) or the like, a bioorganic matter ejecting head used in manufacturing a bio chip, or the like can be used.

In addition, the piezoelectric element according to the invention is not limited to the piezoelectric element which is used in the liquid ejecting head and can be used in a device in addition thereto. As other devices, for example, an ultrasonic device such as an ultrasonic transmitter or the like, an ultrasonic motor, a temperature-electric transducer, a pressure-electric transducer, a ferroelectric transistor, a piezoelectric transformer, a cut-off filter of harmful rays such as infrared rays, an optical filter using a photonic crystal effects of quantum dot formation, a filter such as an optical filter using optical interference of a thin film or the like can be used. In addition, the invention can also be applied to a piezoelectric element used as a sensor and a piezoelectric element used as a ferroelectric memory. As the sensor for which the piezoelectric element is used, for example, an infrared sensor, an ultrasonic sensor, a thermal sensor, a pressure sensor, a pyroelectric sensor, a gyro sensor (angular rate sensor) or the like can be used.

The entire disclosure of Japanese Patent Application No. 2013-016118, filed Jan. 30, 2013 is incorporated by reference herein.

What is claimed is:
1. A liquid ejecting head including a piezoelectric element, the piezoelectric element comprising:
  a first electrode;
  an orientation control layer provided on the first electrode, the orientation control layer having a perovskite structure including Bi in an A site and Fe and Ti in a B site, and the orientation control layer being self-oriented in a (100) plane;
  a piezoelectric body layer provided on the orientation control layer and made of a piezoelectric material of the perovskite structure preferentially oriented in the (100) plane; and a second electrode provided on the piezoelectric body layer.

2. The liquid ejecting head according to claim 1, wherein a thickness of the orientation control layer is in a range of 20 nm or more and 80 nm or less.

3. A liquid ejecting apparatus comprising the liquid ejecting head according to claim 1.

4. A liquid ejecting apparatus comprising the liquid ejecting head according to claim 2.

5. A piezoelectric element comprising:

a seed layer having a perovskite structure including Bi in an A site and Fe and Ti in a B site, and the seed layer being self-oriented in a (100) plane; and a piezoelectric body layer made of a piezoelectric material of the perovskite structure provided on the seed layer, the piezoelectric body layer being preferentially self-oriented in the (100) plane.

6. The piezoelectric element according to claim 5, wherein a thickness of the seed layer is in a range of 20 nm or more and 80 nm or less.

7. A liquid ejecting apparatus comprising the piezoelectric element according to claim 5.

8. A liquid ejecting apparatus comprising the piezoelectric element according to claim 6.

9. A sensor comprising the piezoelectric element according to claim 5.

10. A sensor comprising the piezoelectric element according to claim 6.

\* \* \* \* \*